United States Patent [19]
Asato

[11] Patent Number: 5,250,855
[45] Date of Patent: Oct. 5, 1993

[54] FAST LOGIC CIRCUITS

[75] Inventor: Creighton S. Asato, San Jose, Calif.

[73] Assignee: VLSI Technology, Inc., San Jose, Calif.

[21] Appl. No.: 855,612

[22] Filed: Mar. 20, 1992

[51] Int. Cl.$^5$ .......................... H03K 19/017
[52] U.S. Cl. ...................... 307/443; 307/451
[58] Field of Search ............ 307/443, 445, 451, 585, 307/243

[56] References Cited

U.S. PATENT DOCUMENTS

| | | | |
|---|---|---|---|
| 4,893,031 | 1/1990 | Masuda | 307/443 X |
| 4,940,908 | 7/1990 | Tran | 307/443 |
| 5,091,660 | 2/1992 | Usami | 307/451 X |
| 5,148,057 | 9/1992 | Kitora | 307/443 |
| 5,162,666 | 11/1992 | Tran | 307/243 X |

OTHER PUBLICATIONS

Edward J. McCluskey, *Logic Design Principles* 1986, pp. 117–119.

Primary Examiner—David R. Hudspeth
Attorney, Agent, or Firm—John A. Frazzini

[57] ABSTRACT

N-input Logic Gates are presented that have a high speed transmission path for a first input logic signal $A_1$. For an AND Gate embodiment, a logic signal $A_1$ is applied to an input of a master transmission gate that is transmitting if all of logic signals $A_2, \ldots, A_N$ are logic one signals and is otherwise nontransmitting. For an OR Gate embodiment, a logic signal $A_1$ is applied to an input of a master transmission gate that is transmitting if all of logic signals $A_2, \ldots, A_N$ are logic zero signals and is otherwise nontransmitting.

11 Claims, 4 Drawing Sheets

FAST LOGIC CIRCUITS

FIELD OF THE INVENTION

This invention relates in general to logic circuits such as AND gates and OR gates and relates more particularly to a new structure of such logic circuits that provides an improved speed of operation.

CONVENTION REGARDING REFERENCE NUMERALS

In the figures, the first digit of a reference numeral indicates the first figure in which is presented the element indicated by that reference numeral.

BACKGROUND OF THE INVENTION

Because logic elements, such as AND gates and OR gates, are heavily utilized for processing information, the speed of such gates significantly affects the overall processing speed. Therefore, a common goal of integrated circuit designs is to provide increased processing speed.

In FIG. 1 is illustrated a conventional positive-logic AND gate structure, implemented in Complementary Metal-Oxide-Semiconductor (CMOS) technology. In positive logic, a "logical zero" is indicated by a first reference voltage $V_0$ (also commonly represented as $V_{SS}$) that is less than a second reference voltage $V_1$ (also commonly represented as $V_{DD}$), which is representative of a "logical one". In negative logic, the voltage $V_0$ of a logical zero is greater than the voltage $V_1$ of a logical one. A logical zero is also referred to herein as a "low" signal and a logical one is also referred to herein as a "high" signal.

The following two general design rules are useful in the design of CMOS circuits. First Design Rule: each MOS stage inverts logic. This rule follows inherently from the structure of MOS gates. The practical implication of this rule is that noninverting logic requires an even number of stages. Second Design Rule: n-channel transistors are utilized to conduct logical zero signals and p-channel transistors are utilized to conduct logical one signals. If a particular CMOS circuit violates this rule, it will draw an undue amount of power. The reason for this is that a high voltage $V_1$, applied to a p-channel, depletion-mode MOS field effect transistor, does not completely turn off such a transistor when a low voltage $V_0$ is applied to its source. Similarly, a low voltage $V_0$, applied to an n-channel, enhancement-mode MOS field effect transistor, does not completely turn off such a transistor when a high voltage $V_1$ is applied to its drain.

FIG. 1 illustrates a conventional, positive logic AND gate 10. A pair of p-channel transistors 11 and 12 are connected in parallel between the high voltage source, of voltage $V_1$, and an intermediate signal node 13. A pair of n-channel transistors 14 and 15 are connected in series between the low voltage source, of voltage $V_0$, and the intermediate signal node 14. The gate electrodes of transistors 11 and 15 are connected to a first input 16 on which is applied a first digital control signal $A_1$. The gate electrodes of transistors 12 and 14 are connected to a second input 17 on which is applied a second digital control signal $A_2$. Elements 11-17 function as a NAND gate and represent the first stage 18 of this AND gate. Therefore, this circuit includes a second stage 19 that functions as an inverter to convert this circuit into an AND gate. This second stage includes: a p-channel MOS transistor-110 connected between the high voltage source of voltage $V_1$ and an output signal port 111; and an n-channel MOS transistor 112 connected between output signal port 111 and the low voltage source of voltage $V_0$.

FIG. 2 illustrates a conventional, positive logic OR gate 20. A pair of p-channel transistors 21 and 22 are connected in series between the high voltage source, of voltage $V_1$, and an intermediate signal node 23. A pair of n-channel transistors 24 and 25 are connected in parallel between the low voltage source, of voltage $V_0$, and the intermediate signal node 24. The gate electrodes of transistors 21 and 25 are connected to a first input 26 on which is applied a first digital control signal $A_1$. The gate electrodes of transistors 22 and 24 are connected to a second input 27 on which is applied a second digital control signal $A_2$. Elements 21-27 function as a NOR gate and represent the first stage 28 of this OR gate. Therefore, this circuit includes a second stage 29 that functions as an inverter to convert this circuit into an AND gate. This second stage includes: a p-channel MOS transistor 210 connected between the high voltage source of voltage $V_1$ and an output signal port 211; and an n-channel MOS transistor 212 connected between output signal port 211 and the low voltage source of voltage $V_0$.

Unfortunately, in both of these logic circuits, in response to a change in either or both of input signals $A_1$ and $A_2$, the output signal Z changes only after the period, equal to two gate delays, required for the effects of such change in $A_1$ and/or $A_2$ to ripple through the two stages of these two circuits. It would be advantageous to have AND gate and OR gate circuit designs that do not introduce at most one gate delay between the change of a signal on one of the input nodes and the resulting change in the output signal on the output signal port. It is also important that such circuit not require an undue amount of power.

SUMMARY OF THE INVENTION

In accordance with the illustrated preferred embodiments, positive- and negative-logic AND and OR gates are presented that each provides a high speed transmission path for a first input logic signal $A_1$. This is useful, because, in many applications, a set of input logic signals $A_1, \ldots, A_N$ arrive at the input of a logic gate at different times. Circuit operation speed is therefore enhanced by providing a high speed path for the last of these signals to arrive. This type of logic gate also provides a high-speed path for any signal for which it is otherwise important that such signal experience minimal delay through this logic gate.

In these logic gates, an input logic signal $A_1$ is provided to a signal input of a master transmission gate and the transmission state of this master transmission gate is determined by the values of the remaining input logic signals $A_2, \ldots A_N$ (for some integer $N > 1$). In an AND gate embodiment, this master transmission gate is transmissive if and only if every one of the logic signals $A_2, \ldots A_N$ is equal to a logic one. For an OR gate embodiment, this master transmission gate is transmissive if and only if every one of the logic signals $A_2, \ldots A_N$ is equal to a logic zero. Thus, when input logic signal $A_1$ is the last of these signals to arrive at this logic gate, this master transmission gate will already either be in its transmissive state or in its nontransmissive state when signal $A_1$ arrives. Because of this logic gate structure, no gate delays are introduced into the path of logic signal $A_1$.

In these logic gates, a master switch is connected between the output port of this logic gate and a first reference voltage source. For an AND gate embodiment of this invention, this reference voltage source provides the voltage $V_0$ (which represents a logic zero) and this master switch is transmissive if any one of the logic signals $A_2, \ldots A_N$ is equal to a logic zero. For an OR gate embodiment, this reference voltage source provides the voltage $V_1$ (which represents a logic one) and this master switch is transmissive if any one of the logic signals $A_2, \ldots A_N$ is equal to a logic one.

Preferably, the master transmission gate is "bilateral" (i.e., it is equally effective in transmitting logic zero level signals and logic one level signals). This master transmission gate can be implemented as a series-connected set of $N-1$ transmission gates, each of which has a control input responsive to a uniquely associated one of the logic signals $A_2, \ldots, A_N$. This master switch can be implemented as a parallel-connected set of $N-1$ switches, each of which has a control input responsive to a uniquely associated one of the input logic signals $A_2, \ldots A_N$. For the AND gate embodiment, the control inputs to the master transmission gate are all active-high and the control inputs to the master switch are all active-low. For the OR gate embodiment, the control inputs to the master transmission gate are all active-low and the control inputs to the master switch are all active-high.

DESCRIPTION OF THE PREFERRED EMBODIMENT

Figure 1:
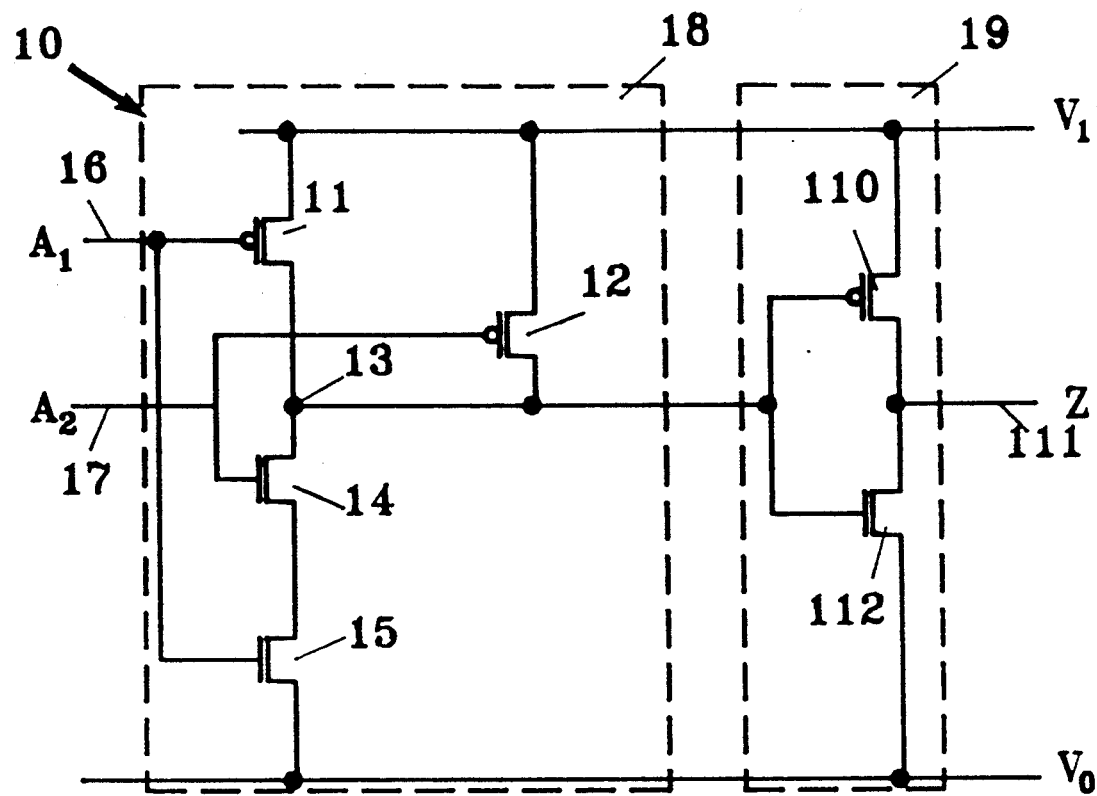
FIG. 1 illustrates a conventional prior art AND gate, implemented in CMOS.
Figure 2:
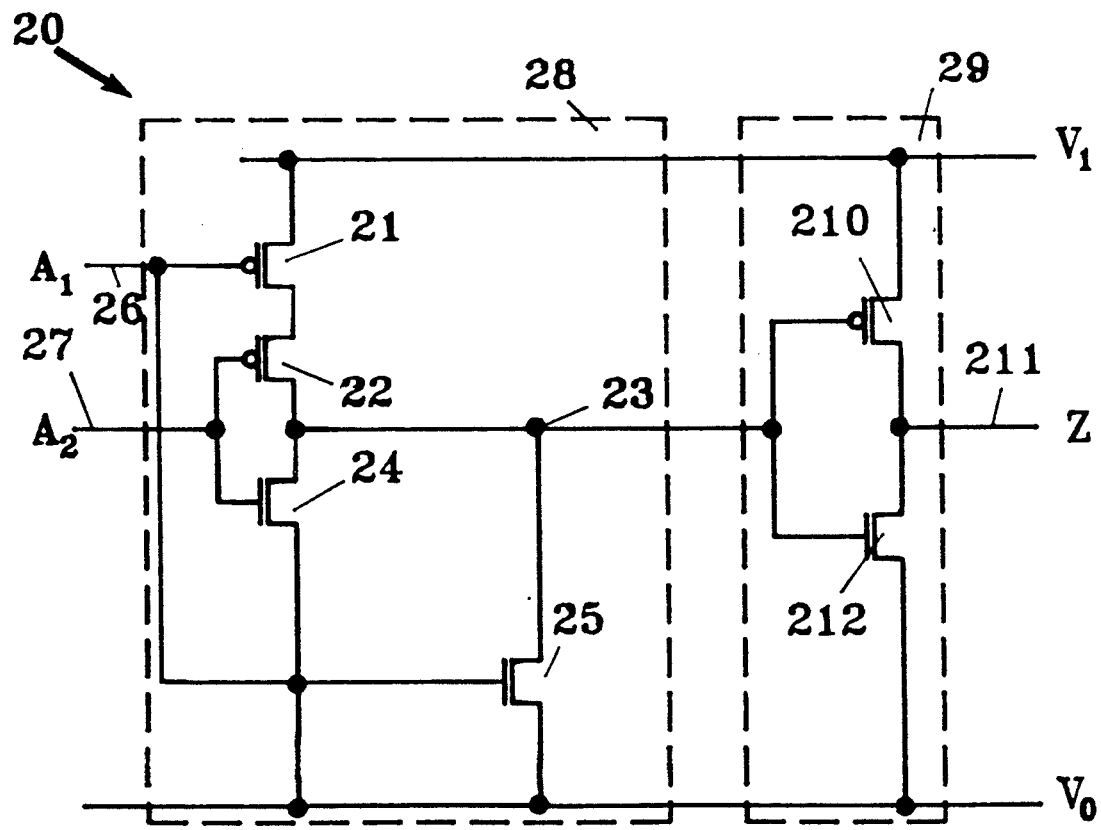
FIG. 2 illustrates a conventional prior art OR gate, implemented in CMOS.
Figure 3:
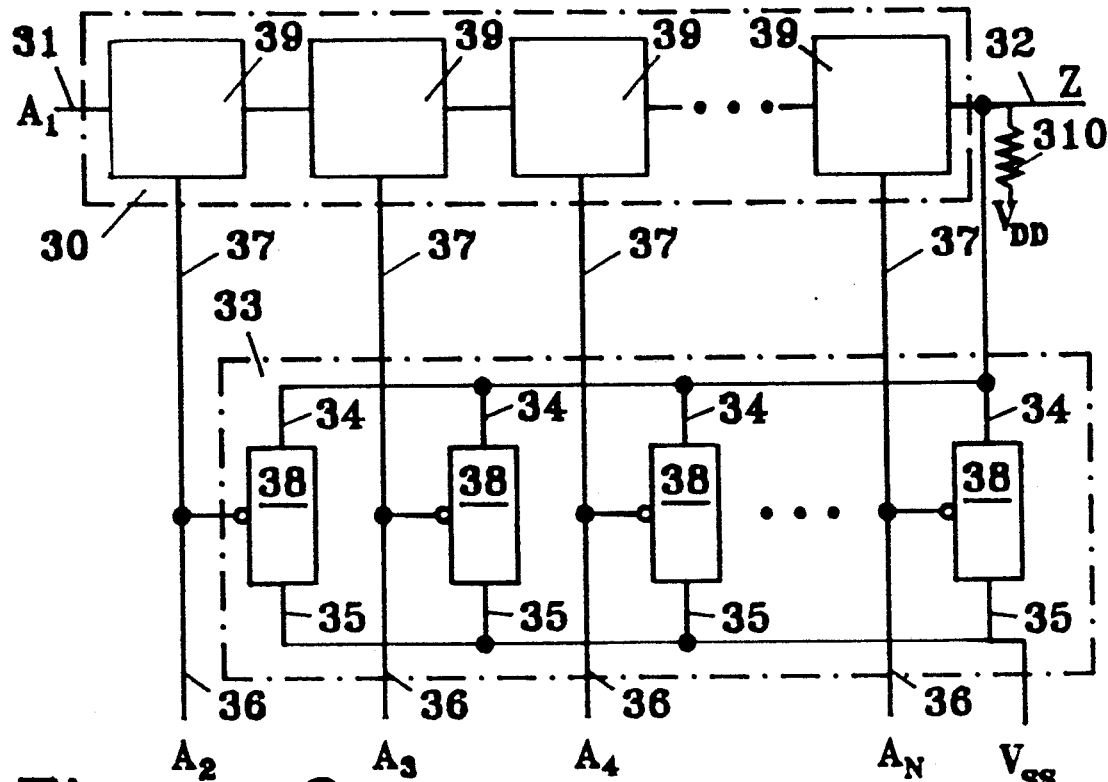
FIG. 3 is a block diagram of an improved AND gate having a high speed transmission path for an input logic signal $A_1$.

FIG. 3 is a block diagram of an improved N-input AND gate having a high speed transmission path for an input logic signal $A_1$. A master transmission gate 30 has an input signal $A_1$ applied to an input port 31 and has an output signal Z produced on an output port 32. A master switch 33 has a set of $N-1$ outputs 34 connected in parallel to output port 32, has a set of $N-1$ inputs 35 connected in parallel to a voltage source $V_0$ and has a set of $N-1$ active-low control inputs 36, on each of which is applied a uniquely associated one of a set of $N-1$ input logic signals $A_2, \ldots, A_N$. A logic zero is represented by voltage $V_0$. These active-low control inputs are also each connected to an associated control input of a uniquely associated one of $N-1$ control inputs 37 of the master transmission gate. In this embodiment, master switch 33 consists of $N-1$ switches 38, each having an input 35, an output 34 and an active-low control input 36 and master transmission gate consists of $N-1$ transmission gates 39 connected in series between the input port 31 and the output port 32.

Figure 4:
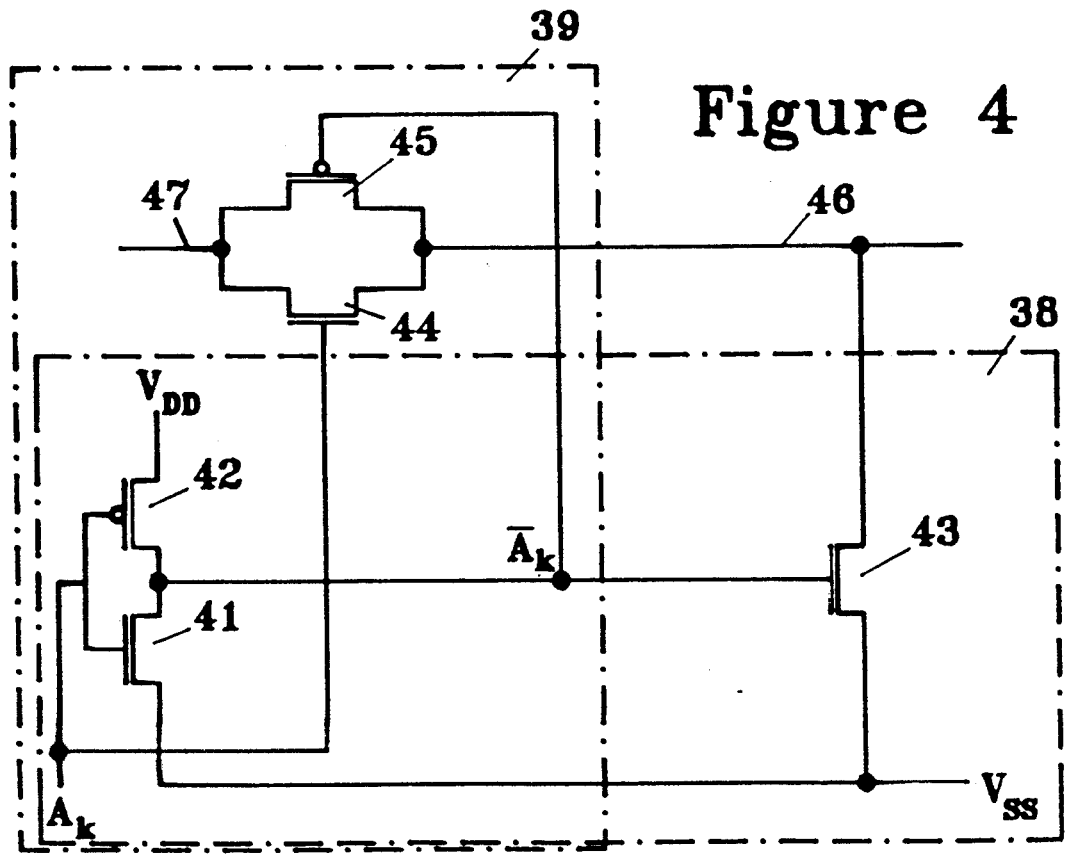
FIG. 4 is a CMOS embodiment of the single control input switch and the single active-low control input transmission gate.

FIG. 4 is a CMOS embodiment of the switch 38 and the transmission gate 39 that are each responsive to the kth input logic signal $A_k$. An inverter, consisting of an n-channel transistor 41 and a p-channel transistor 42 in series between the reference voltages $V_1$ and $V_0$, produces the active-low input of switch 38. The output of this inverter is applied to the gate of an n-channel transistor 43. Switch 38 therefore consists of the combination of elements 41-43.

Transmission gate 39 consists of n-channel transistors 41 and 44 and p-channel transistors 42 and 45. As indicated above, p-channel transistors are more effective in transmitting logic level one signals and n-channel transistors are more effective in transmitting logic level zero signals. When $A_k$ is low, transistors 44 and 45 are both nontransmitting so that this transmission gate is in a nontransmitting state. When $A_k$ is high, transistors 44 and 45 are both transmitting, so that effective transmission channels are provided for both logic level zero and logic level one input signals on an input 47 of this transmission gate. Thus, consistent with the general CMOS rule that logic zero states are to be transmitted by n-channel transistors and logic ones are to be transmitted by logic p-channel transistors, when $A_k$ is high, both of these transmission channels are available in parallel, so that this transmission gate 39 will effectively transmit, to an output 46, an input signal applied to an input 47 of transmission gate 39, regardless of whether this input is a logic zero or a logic one signal.

An inverter (41, 42) is included in transmission gate 39, so that the signal $A_k$ can be applied to the gate of transistor 44 concurrently with the application of signal $\overline{A}_k$ to the gate of transistor 45, whereby both the transmissive channel for zeroes and the transmission channel for ones are both transmissive or nontransmissive. It should be noted that, in the preferred embodiment, inverter (41, 42) is shared by both the switch 38 and the transmission gate 39 of the portions of the master transmission gate 30 and the master switch 33 that are responsive to the kth logic signal $A_k$. This saves both cost and chip area required for this circuit. A pullup, such as resistor 310 or an active-pullup, can be coupled between output port 32 and the reference voltage $V_1$ source to assist the speed of zero-to-one transitions on output port 32. The impedance of this resistor 310 is determined by a tradeoff of power dissipation and zero-to-one transition speed factors. Typically, this impedance is approximately midway between the off and on state impedances of each switch 38. An active pullup would reduce the amount of power dissipation, but would require more chip area and complexity than resistor 310. Therefore, the choice between active and inactive pullups depends on tradeoffs between power dissipation and expense.

Figure 5:
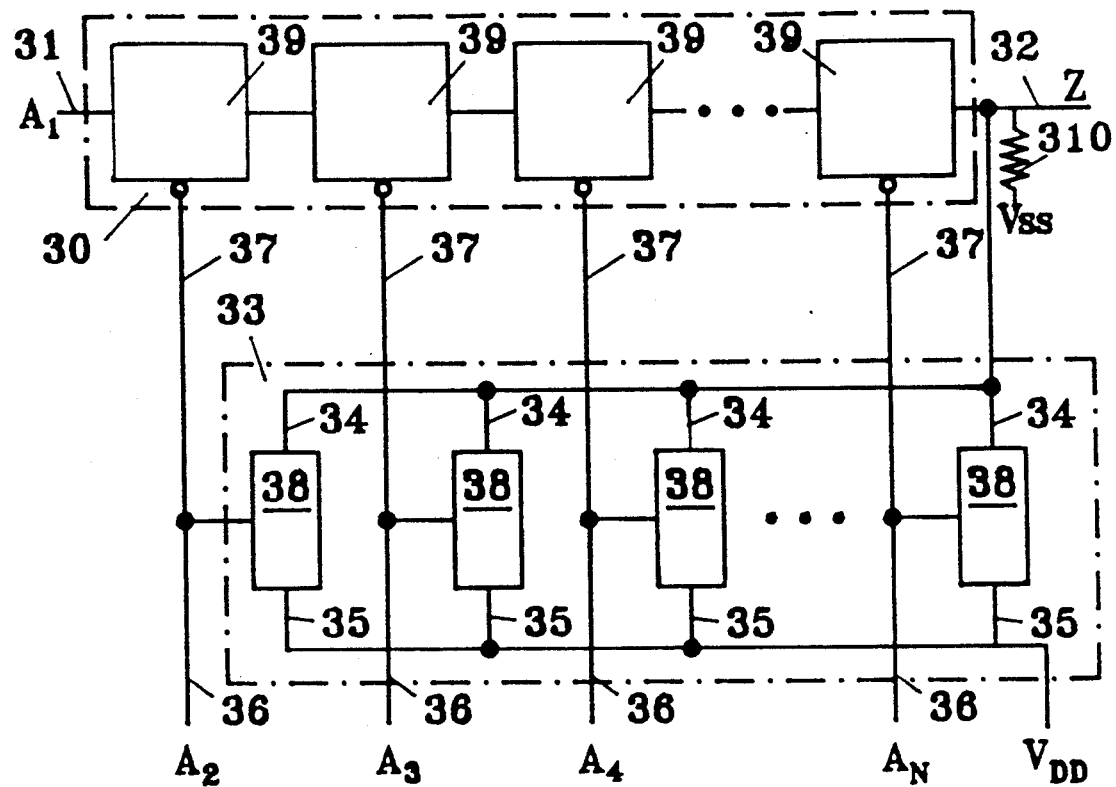
FIG. 5 is a block diagram of an improved OR gate having a high speed transmission path for an input logic signal $A_1$.
Figure 6:
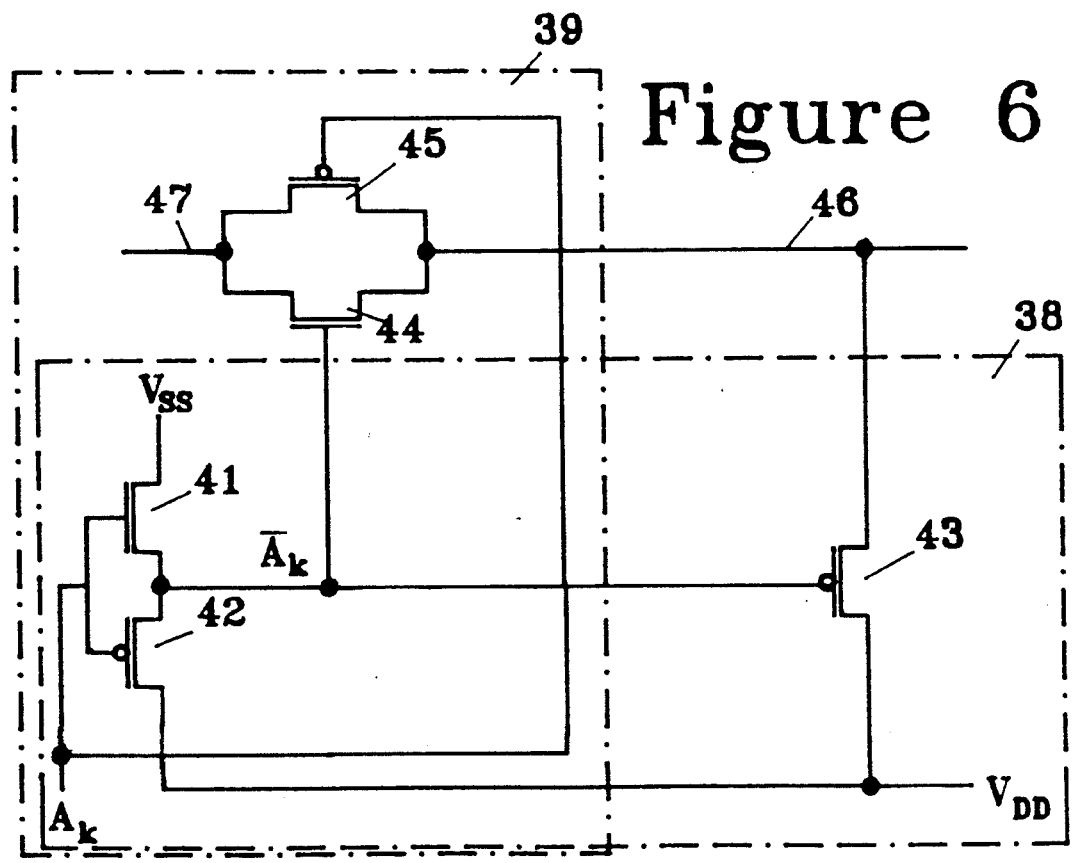
FIG. 6 is a CMOS embodiment of the single active-low control input switch and the single control input transmission gate.

FIG. 5 is a block diagram of an improved OR gate having a high speed transmission path for an input logic signal $A_1$. FIG. 6 illustrates a CMOS embodiment of the switch 38 and the transmission gate in that OR gate. FIG. 5 is substantially the same as FIG. 3, except that the reference voltages $V_0$ and $V_1$ are interchanged, the control inputs of transmission gates 39 are active low instead of active high and the control inputs of switches 38 are active high instead of active low. FIG. 6 is substantially the same as FIG. 4, except that the reference voltages $V_0$ and $V_1$ are interchanged, gates 41 and 42 are interchanged, gate 43 is now inverting, the signal applied to gate 44 is $\overline{A}_k$ instead of $A_k$ and the signal applied to gate 45 is $A_k$, instead of $\overline{A}_k$.

Figure 7:
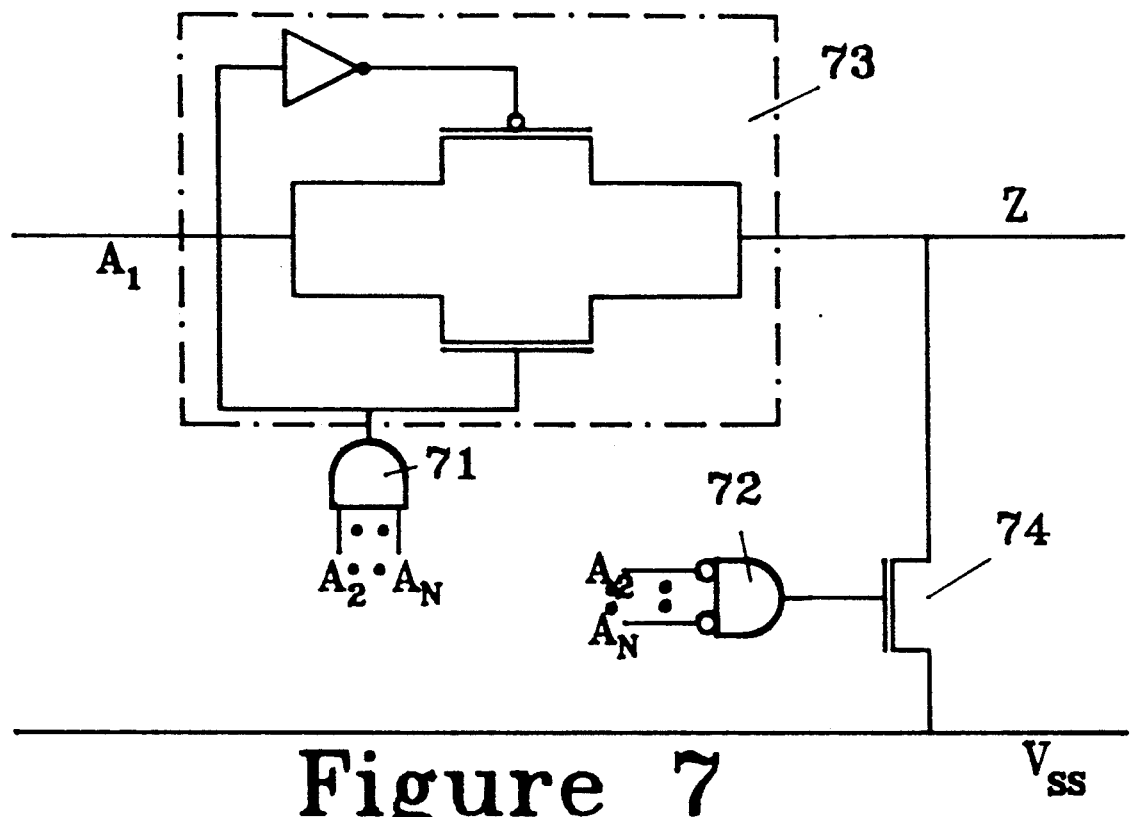
FIG. 7 is a block diagram of an alternate embodiment of the AND gate of FIG. 3.

FIG. 7 is a block diagram of an alternate embodiment of the AND gate of FIG. 3. In this embodiment, signals $A_2, \ldots, A_N$ are applied to associated inputs of an N−1 input AND gate 71 and to an N−1 input NAND gate 72. The output of AND gate 71 is applied to the a transmission gate 73 which is in a transmitting state if all of signals $A_2, \ldots, A_N$ are logic ones and is otherwise nontransmitting. The output of NAND gate 72 is applied to a switch 74 which is in a transmitting state if any of signals $A_2, \ldots, A_N$ are in a logic zero state.

Figure 8:
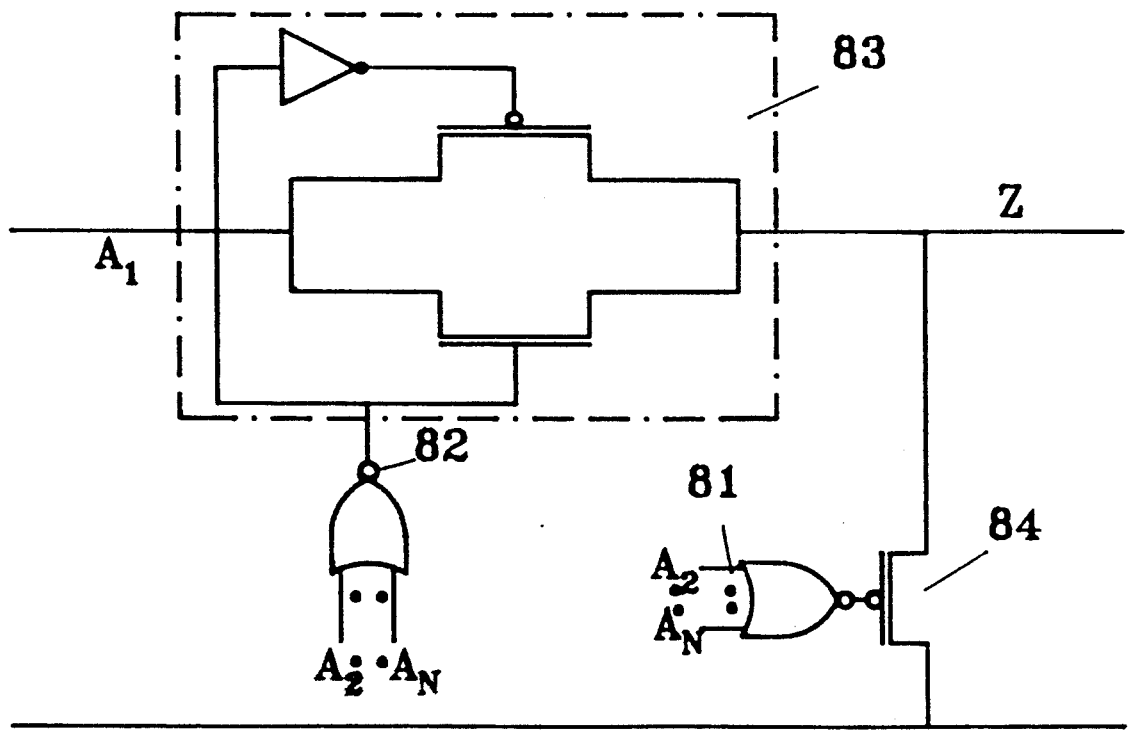
FIG. 8 is a block diagram of an alternate embodiment of the OR gate of FIG. 5.

FIG. 8 is a block diagram of an alternate embodiment of the OR gate of FIG. 5. This embodiment differs from that in FIG. 7 in that AND gate 71 is replaced by a NOR gate 82 and NAND gate 72 is replaced by NOR gate 81.

All of the above embodiments are positive logic embodiments in which the voltage $V_1$ of a logic one state is greater than the voltage $V_0$ of a logic zero state. The N-input, positive-logic AND gate of FIG. 3 also functions as a negative-logic OR gate and the N-input, positive-logic OR gate of FIG. 5 also functions as a negative-logic AND gate. NAND and NOR gates are easily produced by the addition of an inverter at the output of these AND and OR gates. Similarly, these gates are also easily converted to equivalent embodiments by means of DeMorgan's laws.

I claim:

1. An AND Gate comprising:
   a master transmission gate connected between a first input port, on which a first input logic signal $A_1$ is to be applied, and an output on which an output signal Z is produced;
   a master switch connected between a first reference voltage source, of voltage $V_0$ which is representative of a logical zero, and said output port;
   said master transmission gate being responsive to a set of N−1 input logic signals $A_2, \ldots, A_N$ such that this master transmission gate transmissive if and only if all of the N−1 signals $A_2, \ldots, A_N$ are all equal to a logic one; and
   said master switch being transmissive if any of $A_2, \ldots, A_N$ is equal to a logic zero.

2. An AND Gate as in claim 1 wherein said master transmission gate comprises:
   a set of N−1 transmission gates, each having a single control input responsive to a uniquely associated one of the signals $A_2, \ldots, A_N$;
   these N−1 single control input transmission gates being connected in series between the first input port and the output port.

3. An AND Gate as in claim 2 wherein each of the single input transmission gates is bilateral.

4. An AND Gate as in claim 1 wherein said master switch comprises:
   a set of N−1 switches, each having a single active-low control input responsive to a uniquely associated one of the signals $A_2, \ldots, A_N$;
   these N−1 single inverting control input switches being connected in parallel between said first reference voltage source of voltage $V_0$ and said output port.

5. An AND Gate as in claim 4 wherein each single inverting control input switch is a single transistor having its gate input functioning as the control input of this switch; and
   each switch has connected to its gate an inverter having an output coupled to the gate input and having an input responsive to the uniquely associated one of the logic signals $A_2, \ldots, A_N$ for this switch, whereby each of these switches is conducting if and only if its associated one of the logic signals $A_2, \ldots, A_N$ is equal to a logic zero.

6. An OR Gate comprising:
   a master transmission gate connected between a first input port, on which a first input logic signal $A_1$ is to be applied, and an output on which an output signal Z is produced;
   a master switch connected between a first reference voltage source, of voltage $V_1$ which is representative of a logical one and said output port;
   said master transmission gate being responsive to a set of N−1 input logic signals $A_2, \ldots, A_N$ such that this master transmission gate transmissive if and only if all of the N−1 signals $A_2, \ldots, A_N$ are all equal to a logic zero; and
   said master switch being transmissive if any of $A_2, \ldots, A_N$ is equal to a logic one.

7. An OR Gate as in claim 6 wherein said master transmission gate is bilateral.

8. An OR Gate as in claim 6 wherein said master transmission gate comprises:
   a set of N−1 transmission gates, each having a single inverting control input responsive to a uniquely associated one of the signals $A_2, \ldots, A_N$;
   these N−1 single inverting control input transmission gates being connected in series between the first input port and the output port.

9. An OR Gate as in claim 8 wherein each of the single input transmission gates is bilateral.

10. An OR Gate as in claim 6 wherein said master switch comprises:
    a set of N−1 switches, each having a single control input responsive to a uniquely associated one of the signals $A_2, \ldots, A_N$;
    these N−1 single control input switches being connected in parallel between said first reference voltage source of voltage $V_1$ and said output port.

11. An OR Gate as in claim 10 wherein each single control input switch is a single transistor having its gate input functioning as the control of this switch; and
    each switch has connected to its gate an inverter having an output coupled to the gate input and having an input responsive to the uniquely associated one of the logic signals $A_2, \ldots, A_N$ for this switch, whereby each of these switches is conducting if and only if its associated one of the logic signals $A_2, \ldots, A_N$ is equal to a logic zero.

* * * * *